United States Patent [19]
Watanabe

[11] Patent Number: 4,997,741
[45] Date of Patent: Mar. 5, 1991

[54] COLOR IMAGE FORMING METHOD USING LEUCO DYES AND RECORDING MATERIAL CONTAINING LEUCO DYES

[75] Inventor: Toshiyuki Watanabe, Kanagawa, Japan

[73] Assignee: Fuji Photo Film Company, Tokyo, Japan

[21] Appl. No.: 199,635

[22] Filed: May 27, 1988

[30] Foreign Application Priority Data

May 29, 1987 [JP] Japan .................................. 62-136360

[51] Int. Cl.$^5$ .............................................. G03C 1/72
[52] U.S. Cl. .................................... 430/138; 430/211; 430/222; 430/235; 430/241; 503/204; 503/221
[58] Field of Search ............... 430/138, 211, 222, 235, 430/241; 503/204, 221

[56] References Cited

U.S. PATENT DOCUMENTS 4,622,565 11/1986 Watanabe et al. .................. 503/201
4,629,676 12/1986 Hayakawa et al. ................. 430/203
4,775,656 10/1988 Harada et al. ...................... 430/138

FOREIGN PATENT DOCUMENTS 2203613 12/1986 European Pat. Off. .
1400886 7/1975 United Kingdom .
2113860 8/1983 United Kingdom .
2174504 11/1986 United Kingdom .

OTHER PUBLICATIONS

Translation, Japanese Patent Public Disclosure 45084/1983 to Mitsubishi Paper Mills, Ltd.

Primary Examiner—Charles L. Bowers, Jr.
Assistant Examiner—Janet C. Baxter
Attorney, Agent, or Firm—Sughrue, Mion, Zinn, Macpeak & Seas

[57] ABSTRACT

A color image forming method comprises bringing a developer into contact with a recording material comprising a support and a recording layer containing at least two kinds of leuco dyes being capable of forming colors different in hue from each other on contact with the developer. The leuco dyes are a yellow color forming leuco dye, a magenta color forming leuco dye and/or a cyan color forming leuco dye. The equilibrium constants of the reactions between these dyes contained in the recording layer and the developer are not lower than 0.05.

10 Claims, No Drawings

COLOR IMAGE FORMING METHOD USING LEUCO DYES AND RECORDING MATERIAL CONTAINING LEUCO DYES

FIELD OF THE INVENTION

This invention relates to a color image forming method using leuco dyes and a recording material such as a light-sensitive material, a heat-sensitive material and a pressure-sensitive material, and more particularly to a color image forming method and a color recording material which gives a stable color image having well-balanced color.

BACKGROUND OF THE INVENTION

Color image forming methods utilizing a color reaction between a leuco dye and a developer (an acidic substance) are well known.

In an image-forming method using a pressure sensitive recording material or a heat-sensitive recording material, the leuco dye and the developer are arranged under separation from each other and allowed to coexist in the recording layer of the recording material, for instance, by encapsulating the leuco dye. Alternatively, the leuco dye and the developer are separately arranged on individual materials. External energy such as pressure and/or heat is applied to the recording material at the time of the use to bring the leuco dye into contact with the developer.

Recently, there has been proposed an image-forming method employing a recording material (light-sensitive material) comprising a recording layer (light-sensitive layer) containing a light-sensitive silver salt (silver halide), a reducing agent, a crosslinkable compound (polymerizable compound), etc., provided on a support (see, Japanese Patent Provisional Publication No. 61(1986)-69062). In this image-forming method, the light-sensitive material comprising a light-sensitive layer containing a silver halide, a reducing agent, a polymerizable compound, etc. provided on a support is image-wise exposed to form a latent image, and then the material is heated to polymerize the polymerizable compound within the area where the lagent image of the silver halide has been formed. There has also been proposed an image-forming method in which the polymerizable compound within the area where a latent image of the silver halide has not been formed, is polymerized (see, Japanese Patent Provisional Publication No. 62(1987)-70836).

Japanese Patent Provisional Publication No. 61(1986)-73145 discloses an image-forming method in which a light-sensitive material comprising a light-sensitive layer containing further a color image forming substance (e.g., leuco dye) is used. According to this method, a color image can be easily obtained and further a full color image can be formed when two or more kinds of leuco dyes giving different color forming hue are used (see, Japanese Patent Provisional Publication No. 62(1987)-198850, etc.)

In the above-described color image forming methods, it has been found that certain problems are practically caused when two or more kinds of the leuco dyes are used. For instance, when two or more kinds of leuco dyes having a great difference in reactivity with developers therebetween and are used in combination, color balance at the time of the appearance of a color image is liable to worsen and it takes much time until the final color image is obtained. Further, thus-obtained color image has a problem in that only a specific color is greatly faded in long-term storage, that is, it exhibits fading behavior wherein the color balance is lost and the degree of fading of the color image is remarkable. When two or more kinds of leuco dye having no difference in the reactivity with a developer therebetween and having relatively poor reactivity are used in combination, it has been found that it takes much time until a color image appears and fading proceeds with relatively high rate.

SUMMARY OF THE INVENTION

An object of the present invention is to provide a color image forming method and a recording material which rapidly gives a stable color image having a well-balanced color.

Another object of the invention is to provide a color image forming method and a recording material which gives a color image which is superior and stable over a long period of time.

A further object of the invention is to provide a color image forming method recording material which uses leuco dyes having high reactivity with a developer, that is, highly active leuco dyes.

There is provided by the present invention a color image forming method which comprises bringing a developer into contact with a recording material comprising a support and a recording layer containing at least two kinds of leuco dyes being capable of forming colors different in hue from each other on contact with said developer, wherein said leuco dyes are selected from the group consisting of a yellow color forming leuco dye, a magenta color forming leuco dye and a cyan color forming leuco dye and the equilibrium constants of the reactions between the dyes contained in the recording layer and said developer are not lower than 0.05.

In the recording material of the present invention, leuco dyes are so chosen that the equilibrium constant which represents the reactivity (activity) of each of them to the developer is sufficiently high. These leuco dyes are used in combination so that a stable color image which having a well-balanced color can be obtained.

The present inventor has made studies on the color image forming method employing leuco dyes. As a result, it has been found that there is a certain difference in reactivity of leuco dyes to a developer, and the reactivity (activity) of each leuco dye to a developer varies depending on characteristics inherent to each compound. Thus, when such dyes are used in combination to obtain a color image, for instance, when dyes having relatively poor reactivity with developers are used in combination, it takes much time until a color image appears. When dyes having a difference in the reactivity therebetween are used in combination, a difference in a color forming rate is likely caused.

In the recording material of the invention, leuco showing different hue are used and each dye has a given activity or higher activity to the developer so that unevenness in the reaction is hardly caused. Therefore, an image having uniform color balance is easily formed. Thus obtained color image is well stable and is hardly faded even in long-term storage. Further, each hue is equally faded in the course of the fading so that the difference of the fading is scarcely noticeable.

The recording material of the invention is particularly suitable for use in a color image forming method employing a recording material (light-sensitive material) comprising a light-sensitive layer containing silver halide, a reducing agent, a polymerizable compound having an ethylenic unsaturated group and said leuco dyes.

DETAILED DESCRIPTION OF THE INVENTION

Any of leuco dyes can be used in the color image forming method and the recording material of the invention, so long as they have an equilibrium constant of not lower than 0.05. The equilibrium constant is defined as an equilibrium constant of the reaction of each dye with the developer utilized in combination.

In the present invention, the equilibrium constant (apparent equilibrium constant Kapp) means a value calculated from the following equation (I):

$$Kapp = \frac{\tfrac{1}{2}[L]_0}{[DA]_0 - \tfrac{1}{2}[L]_0} \quad (I)$$

In the formula (I), $[L]_O$ represents an initial concentration of the leuco dye in toluene solvent at room temperature and $[DA]_O$ represents an initial concentration of a developer in toluene solvent at room temperature, wherein $[L]_O = 2.0 \times 10^{-5}$ M and DA represents zinc 3,5-di-α-methylbenzyl-salicylate (molecular weight: 378) having the following structural formula:

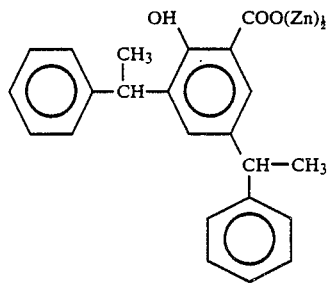

The formula (I) is derived in the following manner:

A relationship between a leuco dye (L) and a developer (DA) is expressed by the following equilibrium reaction equation (1):

$$L + DA \rightleftharpoons LD + A \quad (1)$$

The equilibrium constant is defined by the following equation (2):

$$K = \frac{[LD][A]}{[L][DA]} \quad (2)$$

In the formula (i), "L" is $[L]_O$ and "DA" is $[DA]_O$ before reaction, where $[\ ]_O$ represents initial concentration.

Assuming that when half ($\tfrac{1}{2}[L]_O$) of the leuco dye $[L]_O$ is converted into a developed dye [LD], the concentration of each dye is referred to as $[\ ]_f$.

The equilibrium constant can be determined from the equation (1).

$$K = \frac{[LD]_f[A]_f}{[L]_f[DA]_f} \quad (3)$$

wherein $[LD]_f = \tfrac{1}{2}[L]_O$ $[A]_f = [L]_f \tfrac{1}{2}[L]_O$ $[DA]_f = [DA]_O - \tfrac{1}{2}[L]_O$ These factors are substituted for the equation (S).

Thus, the equilibrium constant (apparent equilibrium constant) defined by the invention can be determined.

$$Kapp = \frac{\tfrac{1}{2}[L]_0}{[DA]_0 - \tfrac{1}{2}[L]_0} \quad (I)$$

The equilibrium constant Kapp can be determined from the equation (I) in the following manner. For instance, there is prepared a mixed solution containing a leuco dye at initial concentration $[L]_O$ of $2.0 \times 10^{-5}$ M and a developer at initial concentration $[DA]_O$ of an arbitrary value. The amount of developed dye is measured, for instance, by spectrophotometry utilizing a visible absorption spectrum of dye. Then, a graph showing the amounts of produced dyes corresponding to each initial concentration of the developer is prepared. The concentration of developer at which half of the leuco dye is converted into a developed dye is interporated, and the concentration of developer is read out. The value of the concentration is referred to as $[DA]_O$ in the equation (I).

Typical examples of the leuco dyes which can be used in the present invention include, but are not limited to, those described below.

The equilibrium constants (Kapp) to a representative developer (3,5-di-α-methylbenzylsalicylate) are given in the attached brackets.

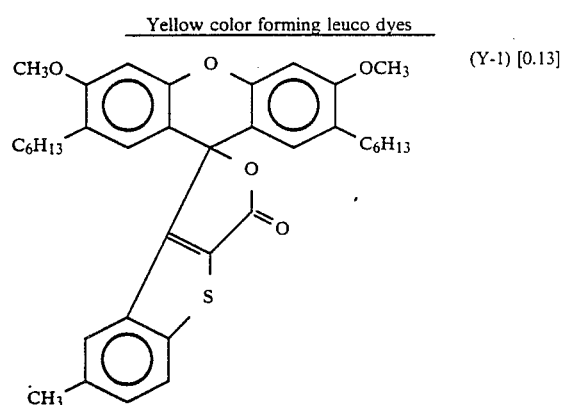

(Y-1) [0.13]

-continued
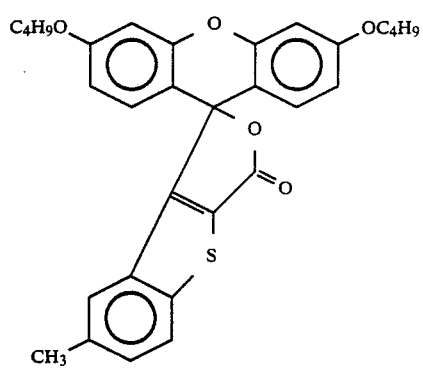 (Y-2) [0.11]
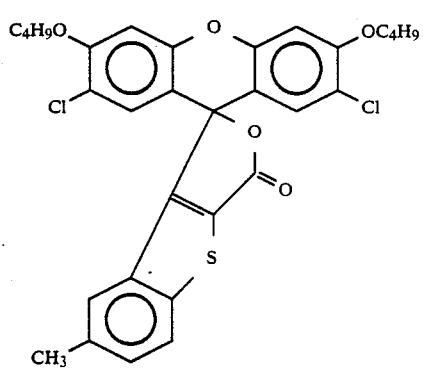 (Y-3) [0.06]
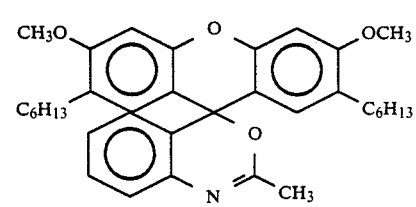 (Y-4) [0.10]
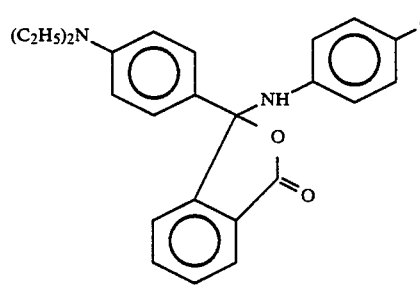 (Y-5) [0.11]
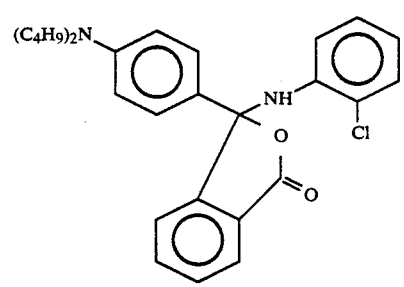 (Y-6) [0.072]
-continued
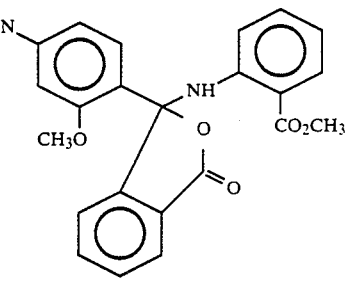 (Y-7) [0.13]
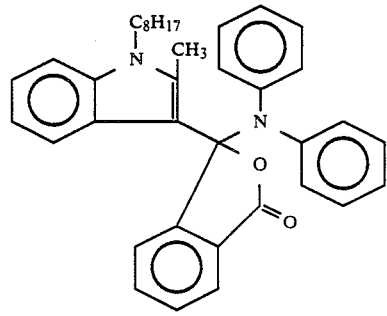 (Y-8) [0.08]
Magenta color image forming leuco dyes
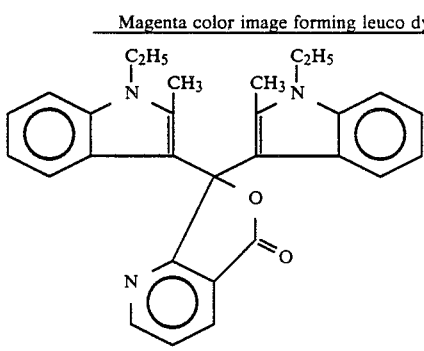 (M-1) [0.13]
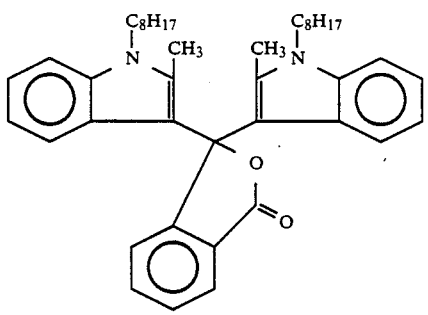 (M-2) [0.14]
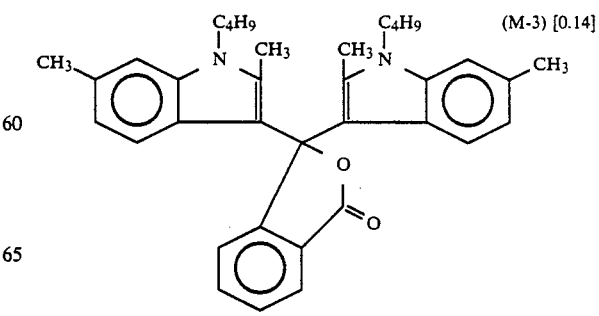 (M-3) [0.14]

-continued
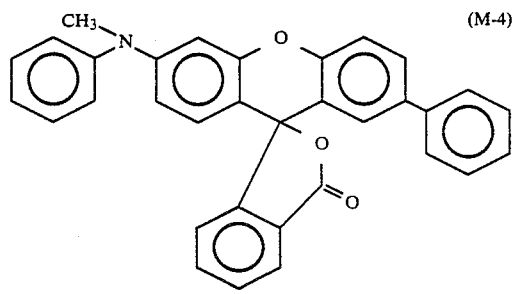
(M-4) [0.075]
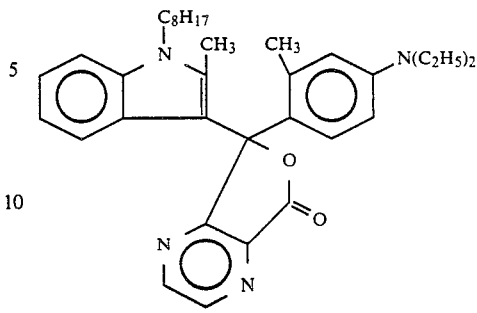
(C-3) [0.094]
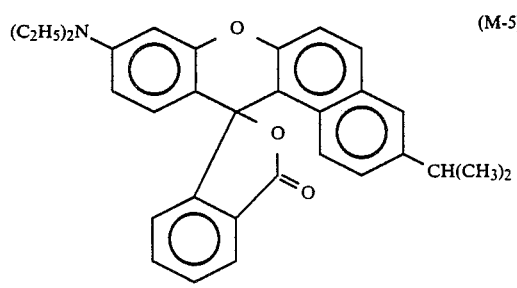
(M-5) [0.09]
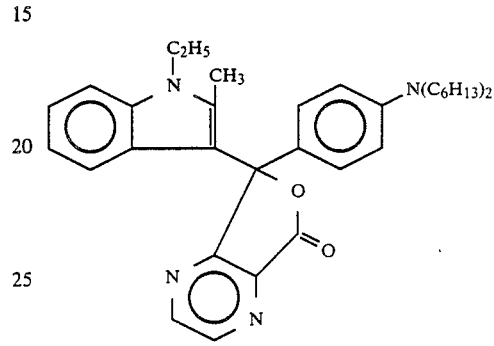
(C-4) [0.11]
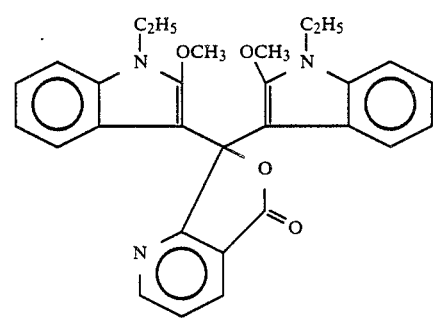
(M-6) [0.15]
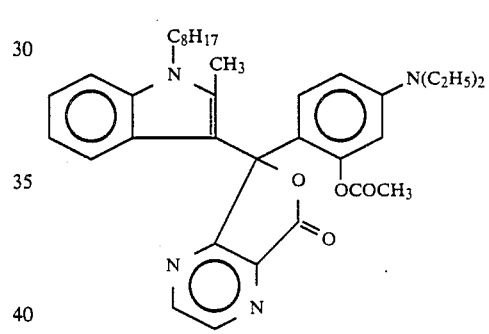
(C-5) [0.095]
Cyan color image forming leuco dyes
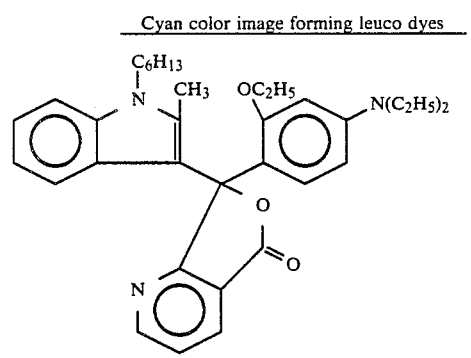
(C-1) [0.11]
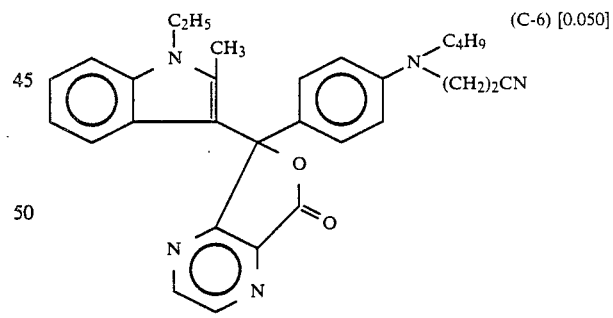
(C-6) [0.050]
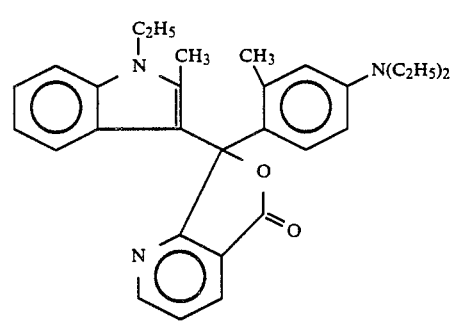
(C-2) [0.053]
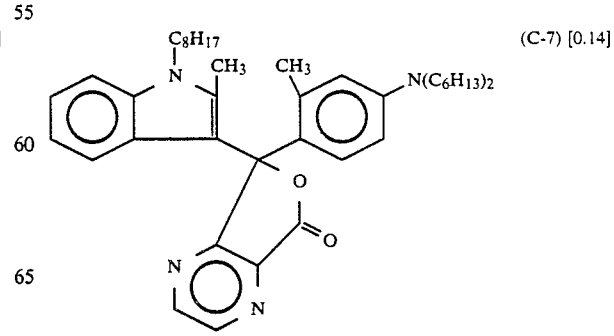
(C-7) [0.14]

-continued

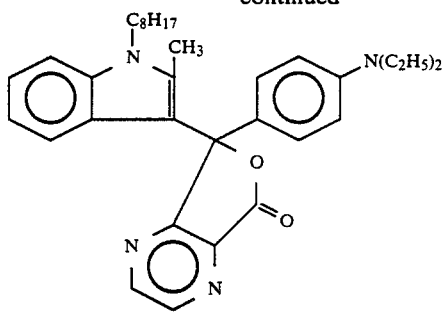
(C-8) [0.16]

It is desirable that the leuco dyes of the invention have a lactone ring in the structural formula.

In the recording material of the invention, the recording layer contains at least two kinds of leuco dyes selected from the above three kinds of the leuco dyes, that is, a yellow color forming leuco dye, a magenta color image forming leuco dye, and a cyan color forming leuco dye. For the same hue, the leuco dyes having the same color forming hue (the same kind of hue) may be used either alone or as a mixture of two or more of them. In this way, there can be obtained a color image having well-balanced color (having good gray balance).

The recording material having the above-described structure according to the invention can be used as a pressure-sensitive material, a heat-sensitive material or a light-sensitive material.

In using the recording material of the invention, the leuco dye is brought into contact with a developer at the time of forming an image. For example, the leuco dye is contained in microcapsules which are then allowed to co-exist with the developer in the recording layer of the recording material. Alternatively, the leuco dye and the developer are arranged separately from each other in such a way that the leuco dye is contained in a layer and the developer is contained in other layer (e.g., one is contained in the recording layer and the other is contained in an image-receiving layer). In other method, they are separately contained in different materials, for example, the leuco dye is contained in a recording material, while the developer contained in an image-receiving material. At the time of forming an image, they are brought into contact with each other by applying pressure to and/or heating the recording or image-receiving material. If desired, the developer may be contained in microcapsules which are different from those containing the leuco dye and may be dispersed in the recording layer. It is desirable that the leuco dye is contained in microcapsules, even if the recording material of the present invention can be used for any of a pressure-sensitive material, a heat-sensitive material and a light-sensitive material.

The recording material of the invention is particularly suitable for use as a light-sensitive material comprising a recording layer (light-sensitive layer) containing a silver halide, a reducing agent and a polymerizable compound having an ethylenic unsaturated group provided on a support.

It is desirable that in the light-sensitive material of the present invention, the leuco dyes are used in combination with three or more kinds of silver halide emulsions (described hereinafter) having light sensitivity in different spectral regions from one another. In this way, a clear color image can be easily obtained.

For example, the recording layer contains two or three kinds of microcapsules selected from the group consisting of light-sensitive microcapsules containing silver halide, a reducing agent, a polymerizable compound having an ethylenic unsaturated group and a yellow color forming leuco dye, light-sensitive microcapsules containing silver halide, a reducing agent, a polymerizable compound having an ethylenic unsaturated group and a magenta color forming leuco dye, and light-sensitive microcapsules containing silver halide, a reducing agent, a polymerizable compound having an ethylenic unsaturated group and a cyan color forming leuco dye.

In another preferred embodiment of the light-sensitive material, an image-receiving material having an image-receiving layer containing the developers is used. In this way, a clear color image can be formed on the image-receiving material.

In the light-sensitive layer of the light-sensitive material, each leuco dye is used in an amount of 0.5 to 50% by weight, preferably 2 to 20% by weight based on that of the polymerizable compound.

If desired, a color image can be formed on the light-sensitive material by enclosing the leuco dyes together with the polymerizable compound having an ethylenic unsaturated group in the microcapsules and allowing the developer and couplers to be contained in the light-sensitive layer without enclosing them in microcapsules. The light-sensitive material which gives a color image without using any receiving material, is described in Japanese Patent Provisional Publication No. 62(1987)-209444.

In the color forming reaction, it is preferred that the leuco dye and the developer are brought into contact with each other under heating conditions, because the color forming reaction can be greatly accelerated by heating.

The heating temperature is generally in the range of 50° to 200° C., preferably 50° to 150° C. The heating time is generally from one second to one minute, preferably 1 to 10 seconds.

The developers which can be used in the invention will be described below.

Examples of the developers include zinc salt of salicylic acid derivatives, acid clay developers (e.g., China clay), phenol-formaldehyde resins (e.g., p-phenylphenol-formaldehyde resin), phenol-salicylic acid-formaldehyde resins (eg., p-octylphenol-zinc salicylate/-formaldehyde resin), zinc rhodanide and zinc xanthate.

Metal salts of salicylic acid derivatives are described in more detail in Japanese Patent Publication No. 52(1977)-1327. Oil-soluble zinc salts of salicylic acid derivatives are described in more detail in U.S. Pat. Nos. 3,864,146 and 4,046,941.

The developer is used in an amount of 0.5 to 100 times by weight, preferably 0.5 to 50 times by weight that of the leuco dye.

The recording material of the present invention includes the pressure-sensitive, heat-sensitive and light-sensitive materials. The recording material of the present invention is described below by referring to the case of the light-sensitive material.

The silver halide, reducing agent, the polymerizable compound having an ethylenic unsaturated group and the support which constitute the light-sensitive material of the invention are described below. Thus composed material is referred herein to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tabular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metal, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean grain (or particle) size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either an area where a latent image of the silver halide has been formed or an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publications Nos 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{(4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl- 2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1.500 mole % based on the amount of silver (contained in the above-mentioned silver halide and an organic silver salt).

There is no specific limitation with respect to the polymerizable compound, except that the compound has an ethylenic unsaturated group. In the case that heat development (i.e.. thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

The polymerizable compound employable for the light-sensitive material of the invention are described in the above-mentioned and later-mentioned publications and applications concerning the light-sensitive material.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that a heat development is utilized in the use of the light-sensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 $g/m^2$ which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 $mm^2$ at pressure of 567 g. Furthermore, a paper support preferably has a pH value in the range of 5 to 9.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent may be also contained in the oil droplets.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

In the case that the shell material is composed of a condensed aldehyde resin, the residual aldehyde preferably is not more than 5 mole based on the amount of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Further more, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

The light-sensitive layer can further contain optional components such as sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator, solvent of the polymerizable compound and water soluble vinyl polymers.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazene-silver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100 % by weight, and more preferably from 0.1 to 40 % by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having melting point of 80° to 180° C. in the form of solid particles.

A base precursor can be used in combination with a catalyst for decomposing the base precursor. For example, a propiolate type base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent and the polymerizable compound are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in S5 the microcapsules under a condition that the base or base precursor is dissolved or dispersed in an aqueous solution of a water retention agent, or under a condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26-28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,025,736; microcapsule particles containing no color former described in U.K. Patent No. 1,235,991; and cellulose particles, and inorganic particles such as particles of talc, kaolin, bentonite, agalmatolite, zinc oxide, titanium dioxide or alumina described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 01746342).

In the case that the solvent of the polymerizable compound is used, the solvent is preferably contained in a microcapsule which is different from the light-sensitive microcapsule.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer. The details of the image-receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water soluble iridium salt, e.g., iridium (III) or (IV) chloride, or ammonium hexachloroiridate, or a water soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added in the course of the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound " includes the photo polymerizable composition and photo polymerizable compound) is used as the medium for preparation of the liquid composition containing another component of the light-sensitive layer. For example, the silver halide, (including the silver halide emulsion), the reducing agent or the leuco dye of the present invention can be dissolved, emulsified or dispersed in the polymerizable compound to prepare the light-sensitive material. Especially, the leuco dye is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Instead of employing the above polymer, the light-sensitive composition can be prepared by dispersing the microcapsules having the silver halide emulsion as core material in the emulsion of the polymerizable compound.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publications Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,707 and U.S. Pat. No. 4,001,140; an electrolytic dispersion and cooling process as described in U.K. Patents Nos. 952,807 and 965,074; a spray-drying process as described in U.S. Pat. No. 3,111,407 and U.K. Patent 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

The preparation of the microcapsule containing the base or base precursor has been mentioned above. The prepared microcapsule can be added to the coating solution at an optional stage.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the image-wise exposure, and in general, the latent image of the silver halide is obtained by imagewise exposure to radiation including visible light. The type of light source and exposure can be selected depending on the light-sensitive wavelengths determined by spectral sensitization or sensitivity of silver halide. The original image generally is a color image.

Development of the light-sensitive material can be conducted simultaneously with or after the imagewise exposure. The development can be conducted using a developing solution in the same manner as the image forming method described in Japanese Patent Publication No. 45(1970)-1149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200 ® C., and preferably from 100° C. to 160° C. Various heating patterns are applicable. The heating time is usually not shorter than 1 second, preferably from 1 second to 5 minutes, and more preferably from 1 second to 1 minute.

Instead of bases or base precursors contained in the light-sensitive material, the development can be proceeds simultaneously or thereafter the bases or base precursors added to the light-sensitive layer. A base sheet (a sheet in which a base is contained) is preferably employed.

In the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

The image can be also formed on the image-receiving material. The image-receiving material is described hereinbelow.

Examples of the material employable as the support of the image-receiving material include baryta paper in addition to various examples which can be employed as the support of the known light-sensitive material. In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer. Further, a polymer having a transmission coefficient of oxygen of not more than $1.0 \times 10^{-11}$ cm$^3$.cm/cm$^2$ .sec.cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the image-receiving layer for the purpose of entering letters, symbols, frames etc, in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

After the image is formed o the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewise exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,200 ml of water were dissolved 14 g of gelatin and 0.5 g of sodium chloride, and the resulting gelatin solution was kept at 70° C. To the gelatin solution, 300 ml of an aqueous solution containing 70 g of potassium bromide and 300 ml of an aqueous solution containing 0.59 mole of silver nitrate were added simultaneously at the same feed rate over 30 minutes. Further, after 5 minutes, to the resulting mixture were added 50 ml of an aqueous solution containing 4.0 g of potassium iodide and 50 ml of an aqueous solution containing 0.024 mole of silver nitrate at the same feed rate over 5 minutes.

Thus, the silver iodobromide emulsion having tetradecahedral grains, uniform grain size distribution and a mean size of 0.19 μm was obtained.

The resulting solution was washed for desalting, and to the emulsion was added 62 ml of 1 % methanol solution of the following sensitizing dye (a) to obtain a silver halide emulsion (A). The yield of the emulsion was 600 g.

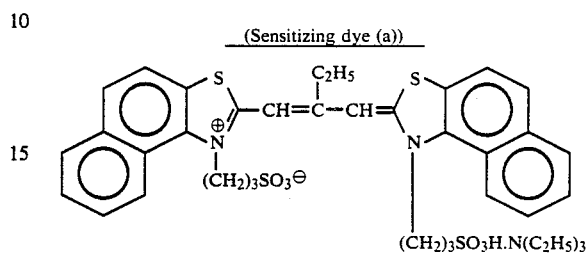

(Sensitizing dye (a))

Preparation of silver benzotriazole emulsion

In 3,000 ml of water were dissolved 30 g of gelatin and 17 g of benzotriazole, and the solution was kept at 40° C. while stirring. To the solution was added 100 ml of an aqueous solution containing 17 g of silver nitrate for 2 minutes. Excess salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate were dissolved 0.2 g of the following copolymer, 11.0 g of the following leuco dye (Y-2) having an equilibrium constant value of 0.11 to 3,5-di-α-methylbenzylsalicylate (i.e., developer) and 0.3 g of Emulex NP-8 (tradename of Nippon Emulsion Co., Ltd.).

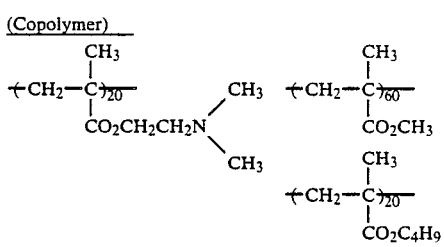

(Copolymer)

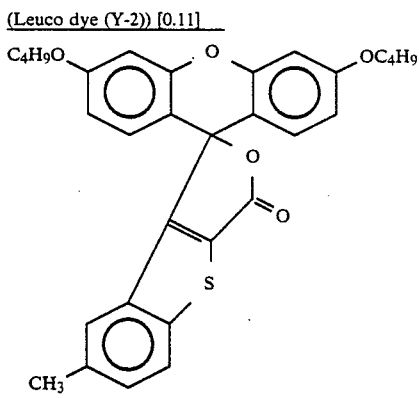

(Leuco dye (Y-2)) [0.11]

To 18.0 g of the resulting solution was added a solution in which 0.3 g of the following reducing agent (i)

and 0.8 g of the following reducing agent (II) are dissolved in 1.8 g of methylene chloride.

(Reducing agent (I))

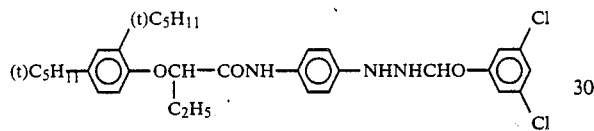

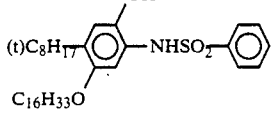

(Reducing agent (II))

To 1.0 g of the silver halide emulsion (A) was added 0.3 g of the silver benzotriazole emulsion, and the mixture was stirred at 15,000 r.p.m. using a homogenizer for 5 minutes to obtain a light-sensitive composition (A).

Preparation of light-sensitive microcapsule

To 9.0 g of 20% aqueous solution of Isobam (tradename of Kuraray Co., Ltd.) was added 50 g of 2.5% aqueous solution of pectin. After the solution was adjusted to pH 4.0 using 10% sulfuric acid, the light-sensitive composition was added to the resulting solution, and the mixture was stirred at 7,000 r.p.m. for 2 minutes to emulsify the light-sensitive composition (A) in the aqueous medium.

To the aqueous emulsion were added 8.0 g of 40% aquoues solution of urea, 3.0 g of 10% aqueous solution of resorcinol, 8.0 g of 37% aqueous solution of formalin and 3.0 g of 8.0% aqueous solution of ammonium sulfate in order, and the resulting mixture was heated at 60° C. for 2 hours while stirring. After the mixture was adjusted to pH 7.0 using 10% aqueous solution of sodium hydroxide, to the mixture was added 4.0 g of 30% aqueous solution of sodium hydrogen sulfite to obtain a dispersion containing light-sensitive microcapsules (A).

Preparation of light-sensitive microcapsule

A dispersion containing light-sensitive microcapsules (B) was prepared in the same manner as in the preparation of the dispersion containing light-sensitive microcapsules (A), except that the following sensitizing dye (b) and the leuco dye (M-2) having an equilibrium constant value of 0.14 to 3,5-di-α-methylbenzylsalicylate (i.e., developer) were used.

(Sensitizing dye (b))

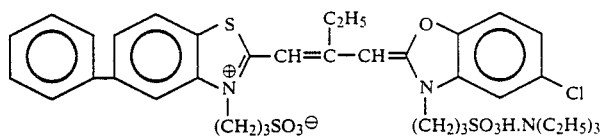

(Leuco dye (M-2)) [0.14]

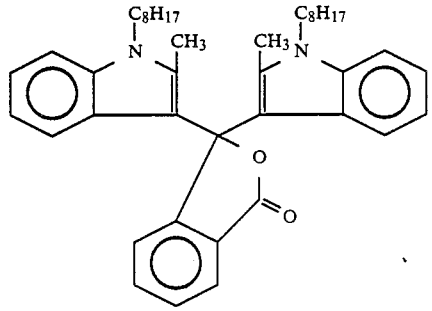

Preparation of light-sensitive microcapsule

A dispersion containing light-sensitive microcapsules (C) was prepared in the same manner as in the preparation of the dispersion containing light-sensitive microcapsules (A), except that the following sensitizing dye (c) and the leuco dye (C-2) having an equilibrium constant value of 0.53 to 3,5-di-α-methylbenzylsalicylate (i.e., developer) were used.

(Sensitizing dye (c))

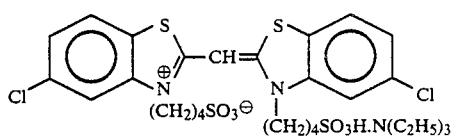

(Leuco dye ((C-2)) [0.053]

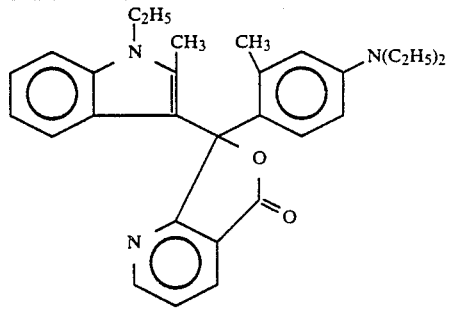

Preparation of light-sensitive material

To each 3.0 g of the microcapsule dispersions (A), (B) and (C) were added 1.0 g of 1% aqueous solution of the following anionic surface active agent and 10 g of 5% aqueous solution of guanidine trichloroacetate to obtain a coating dispersion.

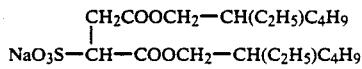

The coating dispersion was coated on a paper support in the coating amount of 50 g/m² and dried at room temperature to obtain a light-sensitive material (101).

EXAMPLE 2

A light-sensitive material (102) was prepared in the same manner as in Example 1, except that the following leuco dyes (Y-7), (M-2) and (C-7) having an equilibrium constant value attached to each formula to 3,5-di-α-methylbenzylsalicylate (i.e., developer) were used instead of the leuco dyes (Y-2), (M-2) and (C-2).

(Leuco dye ((Y-7)) [0.13]

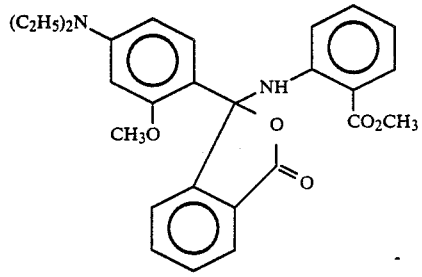

(Leuco dye ((M-2)) [0.14]

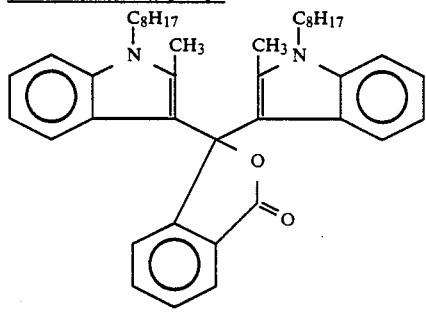

(Leuco dye ((C-7)) [0.14]

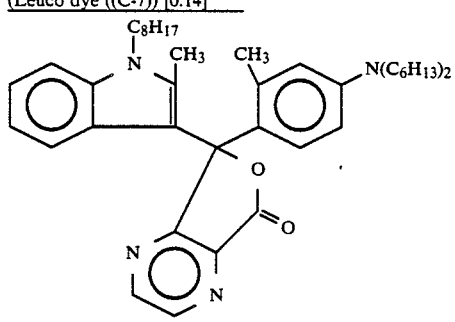

COMPARISON EXAMPLE 1

A light-sensitive material (103) was prepared in the same manner as in Example 1, except that the following leuco dyes (a), (b) and (c) having an equilibrium constant value attached to each formula to 3,5-di-α-methylbenzylsalicylate (i.e., developer) were used instead of the leuco dyes (Y-2), (M-2) and (C-2).

(Leuco dye (a)) [0.029]

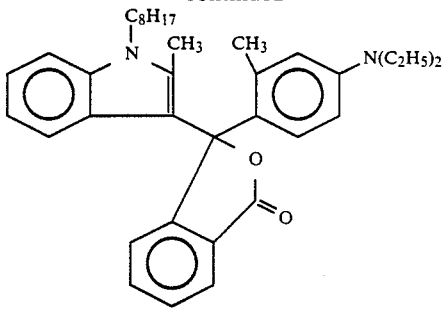

(Leuco dye (b)) [0.023]

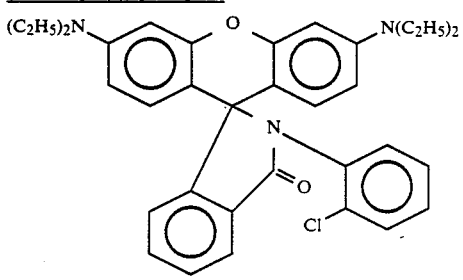

(Leuco dye (c)) [0.023]

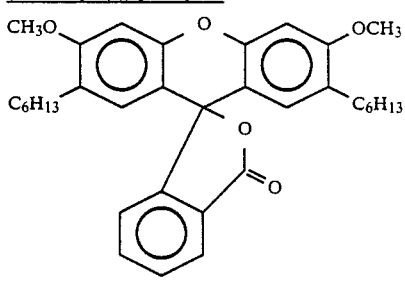

COMPARISON EXAMPLE 2

A light-sensitive material (104) was prepared in the same manner as in Example 1, except that the leuco dye (a) was used instead of the leuco dye (Y-2).

Evaluation of light-sensitive materials

Each of the light-sensitive materials prepared in Examples 1 & 2 and Comparison Examples 1 & 2 was image-wise exposed to light using a tungsten lamp at 200 lux for 1 second through an optical wedge, and then heated on hot plate at 125° C. for 20 seconds. Each of the exposed and heated light-sensitive materials was then combined with the image-receiving material prepared in the following manner and passed through press rolls at pressure of 350 kg/cm² to obtain a transferred image on the image-receiving material.

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. Further, to the resulting mixture was added 50 g of 40% aqueous dispersion of polyethylene wax (tradename Chemipearl W-400, mean particle size: 4 μm, produced by Mitsui Petrochemical Industries, Ltd.), and the resulting mixture was made uniform. The mixture was then uniformly coated on an art paper having basis weight of 43 g/m$^2$ to give a layer having a wet thickness of 30 μm and dried to obtain an image-receiving material.

Each of yellow hued density ($D_B$), magenta hued density ($D_G$) and cyan hued density ($D_R$) of each of the above obtained transferred images (the maximum optical densities ties ($D_{max}$)) according to the passage of time (30 seconds or 10 minutes after transferring) was measured using Macbeth's reflection densitometer.

The results are set forth in Table 1.

TABLE 1

| Light-sensitive material | Dmax after transferring (passage of time) | | | | | |
|---|---|---|---|---|---|---|
| | 30 seconds | | | 10 minutes | | |
| | $D_B$ | $D_G$ | $D_R$ | $D_B$ | $D_G$ | $D_R$ |
| 101 | 0.89 | 0.88 | 0.79 | 1.03 | 1.06 | 1.08 |
| 102 | 0.98 | 0.90 | 1.00 | 1.13 | 1.05 | 1.10 |
| 103 | 0.50 | 0.43 | 0.54 | 0.98 | 0.96 | 1.02 |
| 014 | 0.55 | 0.90 | 0.80 | 0.92 | 1.05 | 1.08 |

It is apparent from the results in Table 1, the light-sensitive materials (101) and (102) of the present invention show high maximum optical density. Therefore, the light-sensitive material of the invention can give a clear image having uniform and stable color balance with respect to yellow, magenta, cyan hued densities.

Further, a day after transferring, the obtained images were exposed to fluorescent lamp at 15,000 lux for 7 days. The fading of color of the images were evaluated in the same manner as the above.

The results are set forth in Table 2.

TABLE 2

| Light-sensitive material | Dmax after transferring (passage of time) | | | | | |
|---|---|---|---|---|---|---|
| | 1 day | | | 7 days | | |
| | $D_B$ | $D_G$ | $D_R$ | $D_B$ | $D_G$ | $D_R$ |
| 101 | 1.04 | 1.06 | 1.08 | 1.02 | 1.04 | 0.99 |
| 102 | 1.13 | 1.05 | 1.10 | 1.07 | 1.05 | 1.09 |
| 103 | 1.02 | 1.00 | 1.05 | 0.78 | 0.82 | 0.70 |
| 104 | 0.93 | 1.08 | 1.08 | 0.75 | 1.03 | 0.98 |

It is apparent from the results in Table 2, the light-sensitive materials (101) and (102) of the present invention can give a clear image having uniform and stable color balance reduced in fading of the color. On the other hand, the light-sensitive materials (103) and (104) for comparison, the color is faded. Especially, the light-sensitive material (103), it is noticeable in fading of yellow hue, the color is out of balance.

I claim:

1. A color image forming method which comprises bringing a developer into contact with a recording material comprising a support and a recording layer containing light-sensitive microcapsules containing a polymerizable compound having an ethylenic unsaturated group and a yellow color forming leuco dye, light-sensitive microcapsules containing a polymerizable compound having an ethylenic unsaturated group and a magenta color forming leuco dye and light-sensitive microcapsules containing a polymerizable compound having an ethylenic unsaturated group and a cyan color forming leuco dye to form a color image, and the equilibrium constant of the reaction between each dye contained in the recording layer and said developer is not lower than 0.05.

2. The color image forming method as claimed in claim 1, wherein said equilibrium constants are not lower than 0.07.

3. The color image forming method as claimed in claim 1, wherein the leuco dyes contained in the recording layer are compounds having a lactone ring.

4. The color image forming method as claimed in claim 1, wherein said recording layer contains light-sensitive microcapsules containing silver halide, a reducing agent, a polymerizable compound having an ethylenic unsaturated group and a yellow color forming leuco dye, light-sensitive microcapsules containing silver halide, a reducing agent, a polymerizable compound having an ethylenic unsaturated group and a magenta color forming leuco dye, and light-sensitive microcapsules containing silver halide, a reducing agent, a polymerizable compound having an ethylenic unsaturated group and a cyan color forming leuco dye.

5. The color image forming method as claimed in claim 1, wherein the contact of the developer with the recording material is performed under heating.

6. The color image forming method as claimed in claim 1, wherein said developer is zinc salt of a salicylic acid derivative.

7. A recording material comprising a support and a recording layer containing light-sensitive microcapsules containing a polymerizable compound having an ethylenic unsaturated group and a yellow color forming leuco dye, light-sensitive microcapsules containing a polymerizable compound having an ethylenic unsaturated group and a magenta color forming leuco dye and light-sensitive microcapsules containing a polymerizable compound having an ethylenic unsaturated group and a cyan color forming leuco dye to form a color image, and the equilibrium constant of the reaction between each dye contained in the recording layer and 3,5-di-α-methylbenzyl-salicylate is not lower than 0.05.

8. The recording material as claimed in claim 7, wherein said equilibrium constants are not lower than 0.07.

9. The recording material as claimed in claim 7, wherein the leuco dyes contained in the recording layer are compounds having a lactone ring.

10. The recording material as claimed in claim 7, wherein said recording layer contains light-sensitive microcapsules containing silver halide, a reducing agent, a polymerizable compound having an ethylenic unsaturated group and a yellow color forming leuco dye, light-sensitive microcapsules containing silver halide, a reducing agent, a polymerizable compound having an ethylenic unsaturated group and a magenta color forming leuco dye, and light-sensitive microcapsules containing silver halide, a reducing agent, a polymerizable compound having an ethylenic unsaturated group and a cyan color forming leuco dye.

* * * * *